(12) United States Patent
Ward et al.

(10) Patent No.: US 8,295,315 B2
(45) Date of Patent: Oct. 23, 2012

(54) TUNABLE LASER

(75) Inventors: Andrew John Ward, Moulton (GB); Robert Walker, Northamptonshire (GB); David James Robbins, Towcester (GB); Douglas Charles John Reid, Rugby (GB); Guy Towlson, Bolton (GB)

(73) Assignee: Oclaro Technology Limited, Northamptonshire (GB)

( * ) Notice: Subject to any disclaimer, the term of this patent is extended or adjusted under 35 U.S.C. 154(b) by 35 days.

(21) Appl. No.: 12/594,213

(22) PCT Filed: Apr. 3, 2008

(86) PCT No.: PCT/GB2008/050238
§ 371 (c)(1),
(2), (4) Date: Feb. 10, 2010

(87) PCT Pub. No.: WO2008/120024
PCT Pub. Date: Oct. 9, 2008

(65) Prior Publication Data
US 2010/0142567 A1    Jun. 10, 2010

(30) Foreign Application Priority Data
Apr. 3, 2007  (GB) .................................. 0706585.7

(51) Int. Cl.
*H01S 3/105* (2006.01)
(52) U.S. Cl. .......... 372/20; 372/23; 372/50.11; 372/102
(58) Field of Classification Search .................... 372/20, 372/23, 50.11, 102
See application file for complete search history.

(56) References Cited

U.S. PATENT DOCUMENTS

| | | | |
|---|---|---|---|
| 5,319,667 A | 6/1994 | Dütting et al. | |
| 5,333,219 A * | 7/1994 | Kuznetsov | 385/45 |
| 6,327,283 B1 * | 12/2001 | Hung | 372/23 |
| 6,359,915 B1 * | 3/2002 | Koch et al. | 372/29.02 |
| 6,728,279 B1 * | 4/2004 | Sarlet et al. | 372/43.01 |
| 6,775,312 B2 * | 8/2004 | Wiedmann et al. | 372/50.1 |
| 6,917,636 B2 * | 7/2005 | Blauvelt et al. | 372/32 |
| 2004/0037342 A1 | 2/2004 | Blauvelt et al. | |
| 2004/0218638 A1 | 11/2004 | Carter et al. | |
| 2006/0251139 A1 | 11/2006 | He | |

FOREIGN PATENT DOCUMENTS

| | | | |
|---|---|---|---|
| DE | 4239655 A1 * | 6/1994 | |
| JP | 55001138 A * | 1/1980 | |
| JP | 61160391 A * | 7/1986 | |
| JP | 61-160391 | 7/1988 | |

(Continued)

OTHER PUBLICATIONS

Whitbread, "Widely Tunable Lasers: The Digital Supermode DBR", Oct. 2003, IEEE LEOS, 634-635.*

(Continued)

*Primary Examiner* — Tod T Van Roy
*Assistant Examiner* — Joshua King
(74) *Attorney, Agent, or Firm* — Patterson & Sheridan, L.L.P.

(57) ABSTRACT

The present invention concerns tunable distributed Bragg reflector (DBR) semiconductor lasers, in particular a DBR laser with a branched optical waveguide 5 within which a plurality of differently shaped lasing cavities may be formed, and a method of operation of such a laser. The laser may comprise a phase control section (418), gain section (420, 422), a sampled grating DBR (412) giving a comb-line spectrum and two tunable, chirped DBRs (414, 416) for broadband frequency training and a coupling section (410).

31 Claims, 7 Drawing Sheets

FOREIGN PATENT DOCUMENTS

| | | | |
|---|---|---|---|
| JP | 63160391 A | * | 7/1988 |
| JP | 63-229796 | | 9/1988 |
| JP | 63229796 A | * | 9/1988 |
| WO | 2007/107187 | | 9/2007 |

OTHER PUBLICATIONS

International Search Report for corresponding Application No. PCT/GB2008/050238 mailed Jul. 18, 2008.

Chacinski Marek et al., "Widely Tunable Wavelength Conversion 10 Gb/s Using a Modulated Grating Y-branch Laser Integrated with an Optical Amplifier", Optical Fiber Communication and the National Fiber Optic Engineers Conference, 2007, OFC/NFOEC 2007. Conference on IEEE, PI, Mar. 1, 2007, pp. 1-3, XP031146284.

A.C. Carter et al., "Monolithic DBR-type fullband tunable lasers", Proceedings of SPIE—The International Society for Optical Engineering, vol. 6020, Nov. 7, 2005, pp. 60200C-1-60200C-9, XP002486223.

D.B. Hunter et al., "Tunable optical transversal filter based on chirped gratings", Electronics Letters, IEE Stevenage, GB, vol. 31, No. 25, Dec. 7, 1995, pp. 2205-2207, XP006003752.

Written Opinion for corresponding Application No. PCT/GB2008/050238.

British Search Report for corresponding Application No. GB0706585.7 dated Jul. 25, 2007.

N. Whitbread., "Widely tunable lasers: the digital supermode BR", 2003, IEEE LEOS Annual Meeting Conference Proceedings, vol. 2, pp. 634-635.

* cited by examiner

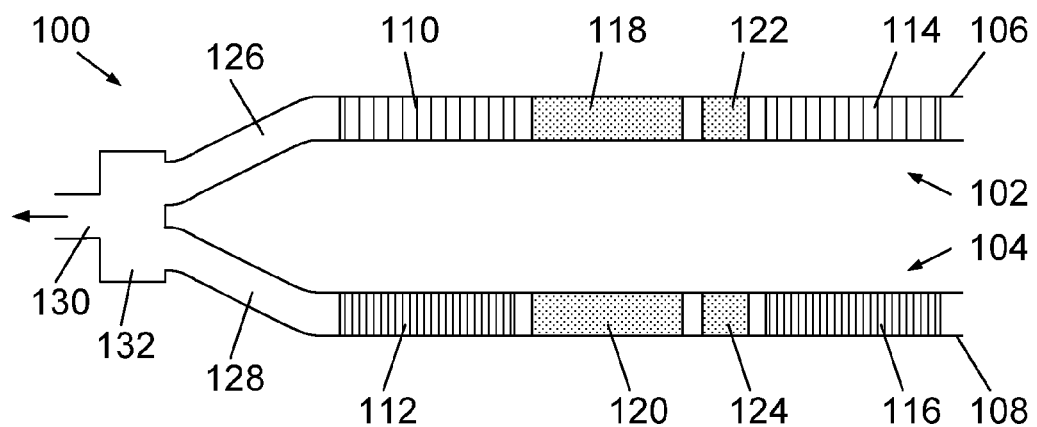
Figure 1 – Prior art
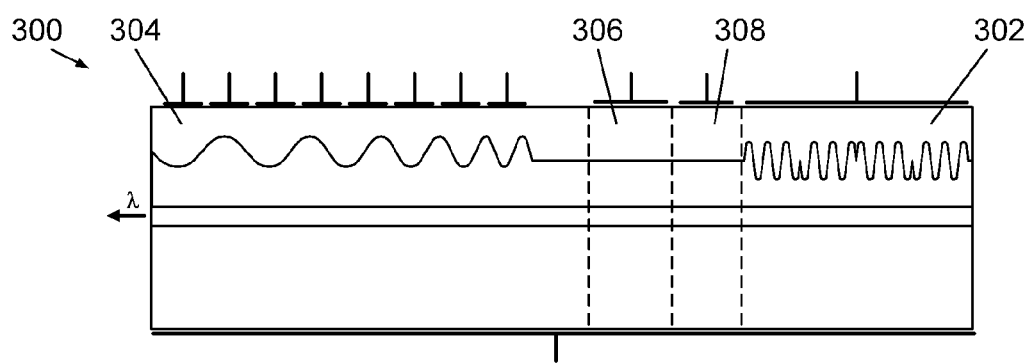
Figure 3 – Prior art

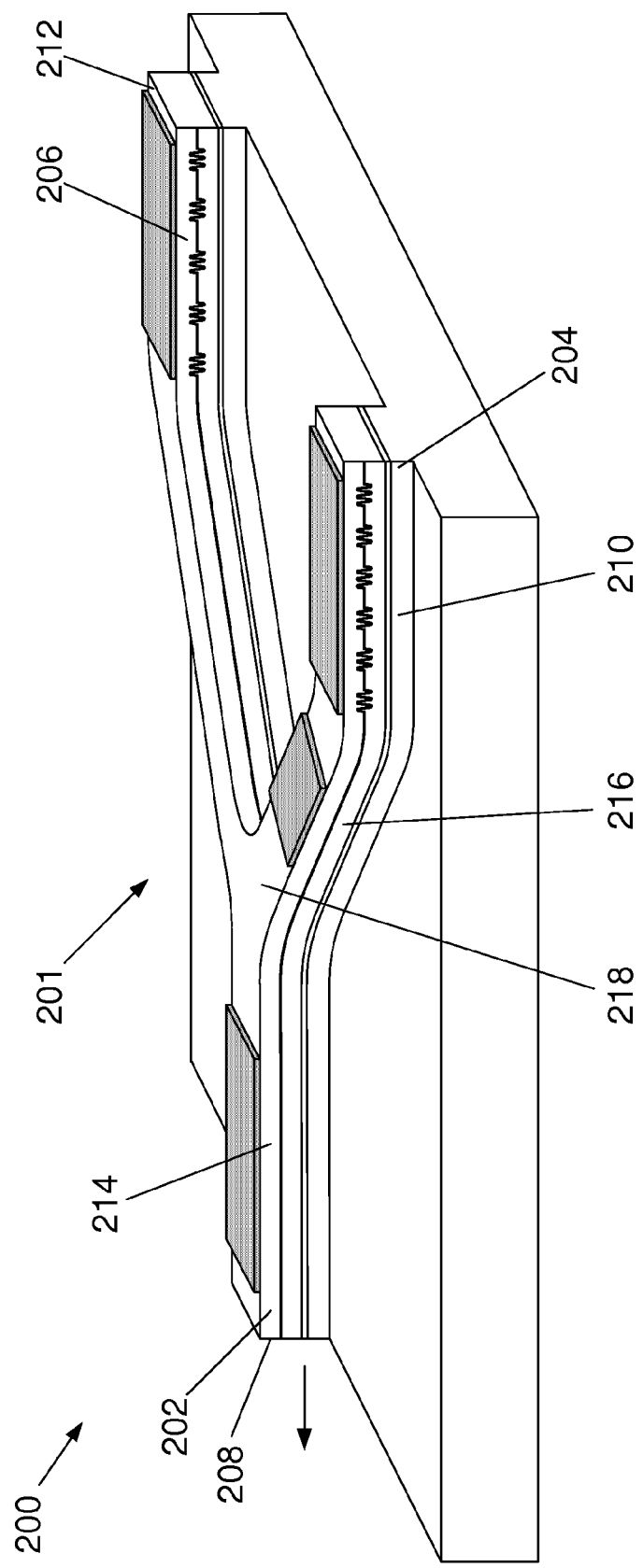
Figure 2 – Prior art

TUNABLE LASER

TECHNICAL FIELD OF THE INVENTION

The present invention concerns distributed Bragg reflector (DBR) semiconductor lasers, in particular a DBR laser with a branched optical waveguide.

BACKGROUND OF THE INVENTION

In the field of optical telecommunications lasers are used to generate optically encoded signals that are transmitted along optical fibres, typically at wavelengths corresponding to channels of the International Telecommunications Union (ITU) grid. The lasers commonly used are monolithically integrated semiconductor lasers.

Different types of semiconductor lasers are commercially available. Distributed feedback (DFB) and distributed Bragg reflector (DBR) lasers with very narrow tuning ranges may be used to provide single channel operation at a substantially fixed wavelength. Historically it has been common to use separate devices to operate at each channel, which has required a discrete device to be installed in a network for each possible channel, making the installation large in size and expensive, whilst also commonly resulting in a significant level of redundancy, since typically not all available channels will be used.

Rather than using separate devices to operate at each channel it is known to produce a single device that is capable of operating across a range of channels by means of monolithically integrating an array of different fixed or narrow tuning range DBR lasers with a passive optical coupler. Such a prior art device is disclosed in US 2005/0244994, which teaches a plurality of passively integrated DBR lasers, each of which comprises a gain section and a DBR. FIG. 1 illustrates schematically an array 100 of two monolithically integrated DBR lasers 102, 104. Each DBR laser 102, 104 comprises an optical waveguide 106, 108 with a front DBR 110, 112 and rear DBR 114, 116. The front DBRs 110, 112 and rear DBRs 114, 116 of each DBR laser 102, 104 bound respective gain sections 118, 120 and phase control sections 122, 124. The DBRs comprise diffraction gratings, each grating being formed by a corrugated surface between layers of semiconductor material with different refractive indices. The front DBRs 110, 112 are designed to be partially transmissive. The rear DBRs 114, 116 are typically more highly reflective than the front DBRs 110, 112.

The optical cavity of the laser is the region of the device within which light is generated and at least partially reflected typically between two cavity ends, so as to create optical feedback and amplified stimulated emission of light. In operation, a lasing cavity is formed between the front 110, 112 and rear DBRs 114, 116 of each DBR laser 102, 104, and laser light is emitted through the partially transmissive front DBR. The output waveguides 126, 128 from the array 100 of DBR lasers 102, 104 are passively coupled to a common output waveguide 130 by means of an optical coupler 132. The DBR lasers operate with mutual independence.

Disadvantageously, for a wide range of operating channels, monolithically integrated arrays of independent DBR lasers require large laser chips, which are not desirable within size limited optical telecommunications packages. Further, the complexity of such chips will typically reduce the possible manufacturing yield, and the complexity of electrical control required to operate the chip may significantly increase the cost of the associated control system.

In the telecommunications industry it is preferable to use lasers with broad tuning ranges, which are capable of operating across a range of telecommunications channels, which can reduce the inventory requirements for the operators of telecommunications systems. Widely tunable DBR lasers are available that provide wavelength tuning across a broad wavelength range, for example covering the whole of the C- or L-band telecommunications bands, corresponding to wavelengths of approximately 1530 to 1565 nm or 1565 to 1610 nm respectively.

A commercially available design of widely tunable DBR laser is disclosed in U.S. Pat. No. 6,728,279. FIG. 2 schematically illustrates a functionally similar DBR laser 200 having a branched optical waveguide 201 comprising a stem waveguide section 202 and two branch waveguide sections 204, 206. The stem waveguide section 202 has a stem optical reflector 208, provided by reflection from a facet of the semiconductor chip on which the laser 200 is formed. A composite optical reflector is provided by the combined reflections of two tunable branch optical reflectors 210, 212 on the branch waveguide sections 204, 206, which are provided by DBRs. The stem optical reflector 208 and the composite optical reflector 210, 212 bound a gain section 214 and a phase control section 216. The branch waveguide sections 204, 206 are optically coupled to the stem optical reflector 208 by means of a passive 1×2 optical coupler 218 (also known as an optical splitter or recombiner) which has a fixed splitting ratio for light passing through the coupler towards the composite optical reflector 210, 212. The splitting ratio is typically wavelength dependent. The branch waveguide sections 204, 206 of the laser's branched optical waveguide 201 may be regarded as being optically in parallel. Light from one branch waveguide section 204, 206 may not couple directly into the other through the optical coupler 218, and can reach the other only by reflection from beyond the optical coupler.

Each of the two tunable branch optical reflectors 210, 212 produces a comb-like spectrum of reflective peaks that are uniformly distributed in wavelength across approximately the same wavelength range, corresponding with the tuning range of the DBR laser, and the reflective peaks of the two reflection spectra are differently spaced. The reflection spectra of the DBRs may be independently tuned in wavelength, by means of respective electrodes and drive circuitry. In operation, the gain section 214 emits a broad spectrum of light, which is at least partially reflected by the stem optical reflector 208 across a broad wavelength range and by the composite optical reflector 210, 212 at wavelengths corresponding with the peaks of the comb-like reflection spectra. A spectral peak from each of the comb-like reflection spectra may be tuned to become coincident in a chosen wavelength, forming a reinforced spectral peak in the reflection spectrum of the composite rear reflector 210, 212.

In operation, it is only at the wavelength of the reinforced spectral peak, at which the optical feedback of the laser cavity is greatest, that the optical gain produced by the light emitting gain section 214 is sufficient to overcome the optical loss in the laser cavity. This results in lasing at that wavelength and emission of laser light through the stem optical reflector 208. Thus, in operation, both branch waveguide sections 204, 206 of the branched optical waveguide 201 always form part of the lasing cavity, and so in this design of laser 200 the lasing cavity is always branched in the same way as the branched optical waveguide.

Coarse tuning of the laser emission over a broad range of wavelengths may be provided by relative tuning of the reflective peaks of the comb-like reflection spectra of the two DBRs 210, 212. The system of relative adjustment of two scales with differently spaced pitches was devised by Pierre Vernier, and this method of tuning a DBR laser is referred to as Vernier tuning.

Other known designs of Vernier tuned DBR laser include those disclosed in U.S. Pat. No. 4,896,325 and US 2004/0240490. These documents disclose lasers with unbranched optical waveguides, which use different geometries of reflectors and DBRs from that illustrated in FIG. 2.

In a Vernier tuned DBR laser, the non-lasing reflective peaks in the comb-like reflection spectrum of one tunable branch optical reflector 210, 212 must be sufficiently different in wavelength from the non-lasing peaks in the comb-like reflection spectrum of the other tunable branch optical reflector to ensure that there is no risk of significant mode competition with the lasing mode, due to complete or partial overlapping of other reflective peaks. This condition provides a fundamental limitation upon the breadth of tuning range that is achievable with the Vernier tuning method.

A further design of widely tunable DBR laser with an unbranched optical waveguide is described in U.S. Pat. No. 7,145,923, and a schematic cross-section is illustrated in FIG. 3. The tuning mechanism of the laser 300 is different to those described previously. The laser 300 comprises a rear optical reflector comprising a first DBR 302 and a front optical reflector comprising a second DBR 304, a gain section 306 and a phase control section 308. A first DBR 302 produces a comb-like reflection spectrum of peaks, and the second DBR 304 produces a relatively uniform broadband reflection spectrum, in its off state (i.e. not tuned). In operation, a portion of the reflection spectrum of the second DBR 304 is tuned to overlap with another portion, to produce a broad reinforced reflective peak. When the broad reinforced reflective peak and one of the reflective peaks in the spectrum of the first DBR 302 are tuned to coincide in wavelength, the round trip gain of the laser cavity becomes sufficient to overcome the optical cavity loss and to achieve lasing at that wavelength. This DBR laser tuning method is known as the digital supermode tuning method.

The tuning range of the laser 300 of FIG. 3 may be extended by increasing the number of peaks in the comb-like reflection spectrum of the first DBR 302 and their wavelength range, and correspondingly increasing the spectral wavelength range of the second DBR 304. However, increasing the wavelength range of the second DBR 304 necessitates that it should be longer, thus increasing the length of the lasing cavity, and the closeness of the optical modes within the cavity with respect to wavelength, which may increase the strength of unwanted optical side modes to the lasing mode.

Thus there remains a need for an improved design of DBR laser that provides an enhanced wavelength tuning range, and seeks to mitigate at least some of the problems of prior art tunable laser designs.

STATEMENT OF INVENTION

In accordance with a first aspect of the present invention there is provided a tunable semiconductor laser. The laser comprises a branched optical waveguide formed by a stem waveguide section optically coupled to at least two branch waveguide sections. A stem optical reflector is provided within the stem waveguide section. Tunable branch optical reflectors are provided within the branch waveguide sections. A gain section is provided, which is bounded by the stem optical reflector and at least one of the tunable branch optical reflectors. One of the tunable branch optical reflectors has a reflection spectrum within a first wavelength range. Another of the tunable branch optical reflectors has a reflection spectrum within a second wavelength range. The first and second wavelength ranges are different. In operation a laser cavity is formed between the stem optical reflector and at least one of the tunable branch optical reflectors, and the laser emits light at a wavelength within either the first or the second wavelength range.

The first and second wavelength ranges may not overlap with respect to wavelength. Alternatively they may overlap by a small amount. The overlap may be by less than 25% of the width one of the wavelength ranges, and preferably less than 15%. In the case that a tunable branch optical reflector has a top hat-like reflection spectrum, the wavelength range may be defined as lying between wavelengths at which the reflection intensity is half that of the average intensity of the main part of the reflection spectrum, disregarding any end peaks to the spectral profile. In the case of a tunable branch optical reflector with a comb-like reflection spectrum comprising a series of peaks, the wavelength range may be defined as lying between the outermost wavelengths with intensities half that of the highest peak.

The lasing cavity may be formed between the stem optical reflector and one of the tunable branch optical reflectors. Consequently, by forming the lasing cavity with different, or more than one, tunable branch optical reflectors, differently shaped lasing cavities can be defined within the branched optical waveguide. For example, a lasing cavity formed with a first tunable branch optical reflector may allow tuning within a first wavelength tuning range, whereas a lasing cavity formed with a second tunable branch optical reflector may allow tuning within a second wavelength tuning range, which is adjacent to or only partly overlaps with the first wavelength tuning range. This provides wavelength tuning over a greater range than with just one tunable branch optical reflector. Alternatively the lasing cavity may be formed between the stem optical reflector and a selected combination of unable branch optical reflectors. In particular, where the upper limit of the wavelength range of a tunable branch optical reflector is close to, or overlaps with, the lower limit of the wavelength range of another, then the laser may be operated between or close to these limits by tuning segments from both tunable branch optical reflectors together, to form a reinforced reflective peak, and leading the laser to lase with a branched lasing cavity.

A tunable branch optical reflector may be provided within each of the tunable branch optical reflectors.

The stem optical reflector and/or the tunable branch optical reflector may be a distributed Bragg reflector "DBR". Preferably both the stem optical reflector and the tunable branch optical reflector are DBRs. The stem optical reflector may be a broadband reflector, for example being a facet, notched waveguide or a DBR.

Optical coupling between different sections of the laser may be provided by an optical coupler. The optical coupler may have a substantially fixed split ratio, for a given wavelength, or may have a tunable split ratio.

The gain section may be provided in the stem waveguide section and/or one or more of the branch waveguide sections. More than one gain section may be provided, in which case their gain spectra may be centred at different wavelengths. Gain spectra are typically peaked, in which case it may be preferable to provide more than one gain section, the different sections having differently centred gain spectra, so that the most appropriate section may be used for the lasing wavelength. Gain sections with differently centred gain spectra may be provided on the stem waveguide section. However, to keep the laser cavity lengths lower it may be advantageous to provide the gain sections with differently centred gain spectra on the respective branch optical waveguides corresponding with the wavelength range of the corresponding tunable branch optical reflector.

One or more phase control sections may be provided, bounded by the stem optical reflector and a tunable branch optical reflector. The phase section or sections enable very fine tuning of the lasing wavelength, by tuning the wavelengths of the cavity modes with respect to the reflection spectra of the reflectors defining the ends of the lasing cavity.

The phase control sections may be provided on the stem waveguide section and/or a branch waveguide section. At least in the case that the laser may operate with a branched laser cavity configuration, then the provision of a phase control section on a branched waveguide section may allow control of the relative phase of the phase relationship between the two or more tunable branch optical reflectors at the end of the cavity.

The stem optical reflector and the tunable branch optical reflector or reflectors forming the ends of the laser cavity must both be at least partially reflective at the lasing wavelength. The reflections from the ends of the laser cavity provide optical feedback to the gain section, causing amplified stimulated emission. In the case that light is emitted from the laser cavity through the stem optical reflector, it is at least partially transmissive at the lasing wavelength. Similarly, in the case that light is emitted from the laser cavity through the tunable branch optical reflector or reflectors, then it or they are at least partially transmissive at the lasing wavelength. In the case that light is emitted from the laser cavity through a tunable branch optical reflector, the branch waveguide sections may be coupled to a common waveguide section.

At least one of the branch waveguide sections may be coupled to two or more sub-branch waveguide sections. Tunable sub-branch optical reflectors may be provided within each sub-branch waveguide section. Thus a tunable branch optical reflector may be a composite optical component, comprising a plurality of tunable sub-branch optical reflectors. The tunable sub-branch optical reflectors may have comblike reflection spectra of reflective peaks. The reflective peaks of different comb-like reflection spectra that are coupled to a common branch waveguide section may be differently spaced. The differently spaced combs of reflective peaks may be tuned with respect to wavelength according to a Vernier tuning method, in which a single peak from each comb is overlapped in wavelength to create a reinforced reflective peak.

The stem optical reflector may be tunable, comprising a stem tunable DBR producing a comb-like reflection spectrum of reflective peaks, and the tunable branch optical reflectors may be tunable branch DBRs adapted to reflect at a plurality of wavelengths. Portions of the reflection spectra of the tunable branch DBRs may be selectively tuned to a lower wavelength to correspond with the wavelength of reflection of another portion, thereby enhancing the reflectivity of the DBR at that lower wavelength, forming a reinforced reflective peak. The reinforced reflective peak at the lower wavelength may coincide with a reflective peak of the comb-like reflection spectrum of the stem tunable DBR. The return trip optical loss of the laser cavity at the wavelength of the reinforced reflective peak may be sufficiently low that the laser cavity is able to lase at that wavelength. In the case that the stem optical reflector comprises a DBR, a single electrode may be provided on the DBR to tune the whole comb-like reflection spectrum together, with respect to wavelength. The tunable branch DBRs may have top hat-like reflection spectra. The tunable branch DBRs may comprise chirped Bragg gratings. Segmented electrodes may be provided on the tunable branch DBR, enabling different portions of the DBR to be selectively tuned with respect to wavelength.

Output light from the tunable semiconductor laser may be optically coupled to a semiconductor optical amplifier. Light emitted from the laser cavity may be coupled to photodetectors that may be used to monitor performance of the laser. Light emitted from the opposite end of the lasing cavity from the laser output may be coupled to a photodetector.

In accordance with a second aspect of the present invention there is provided a method of operating a tunable semiconductor laser according to the first aspect of the invention. A gain section may be driven to produce light and a portion of the reflection spectrum of a tunable branch optical reflector is selectively tuned to spectrally overlap with another portion of the same or another tunable branch optical reflector to form a reinforced reflective peak. The laser cavity may lase at a wavelength corresponding to that of the reinforced reflective peak. The lasing wavelength is that at which the optical gain from the gain section is able to overcome the round trip optical loss of the laser cavity.

The operating wavelength of the laser may be tuned in different ways. Tuning may be provided by tuning the tunable branch optical reflector, in particular by tuning the wavelength of the reinforced reflective peak. Tuning may also be provided by tuning the reflection spectrum of the stem optical reflector. Tuning may also be provided by tuning the phase section. Tuning the phase section may comprise tuning the optical path length of the phase section. Tuning of a component of the laser may be by means of an electrical current applied through the corresponding section of waveguide, or by the application of a bias across the respective section of waveguide, causing refractive index change in the respective portion of waveguide. The current or bias may be applied by means of electrodes provided on sections of the waveguide, on the back face of the semiconductor chip, or adjacent to and on the same side of the semiconductor chip as the waveguide.

The laser cavity may be formed between the stem optical reflector and one tunable branch optical reflector, giving rise to an unbranched laser cavity. The laser cavity may be formed between the stem optical reflector and a selected combination of tunable branch optical reflectors, giving rise to a branched laser cavity.

The laser may be tuned by the method of digital supermode tuning. Alternatively the laser may be tuned by the method of Vernier tuning.

BRIEF DESCRIPTION OF THE DRAWINGS

Exemplary embodiments of the invention are hereinafter described with reference to the accompanying drawings, in which:

FIG. 1 shows a monolithically integrated array of DBR lasers.

FIG. 2 shows a Vernier tunable DBR laser with a branched waveguide.

FIG. 3 shows a further design of widely tunable DBR laser with an unbranched waveguide.

DESCRIPTION OF PREFERRED EMBODIMENTS

Figure 4:
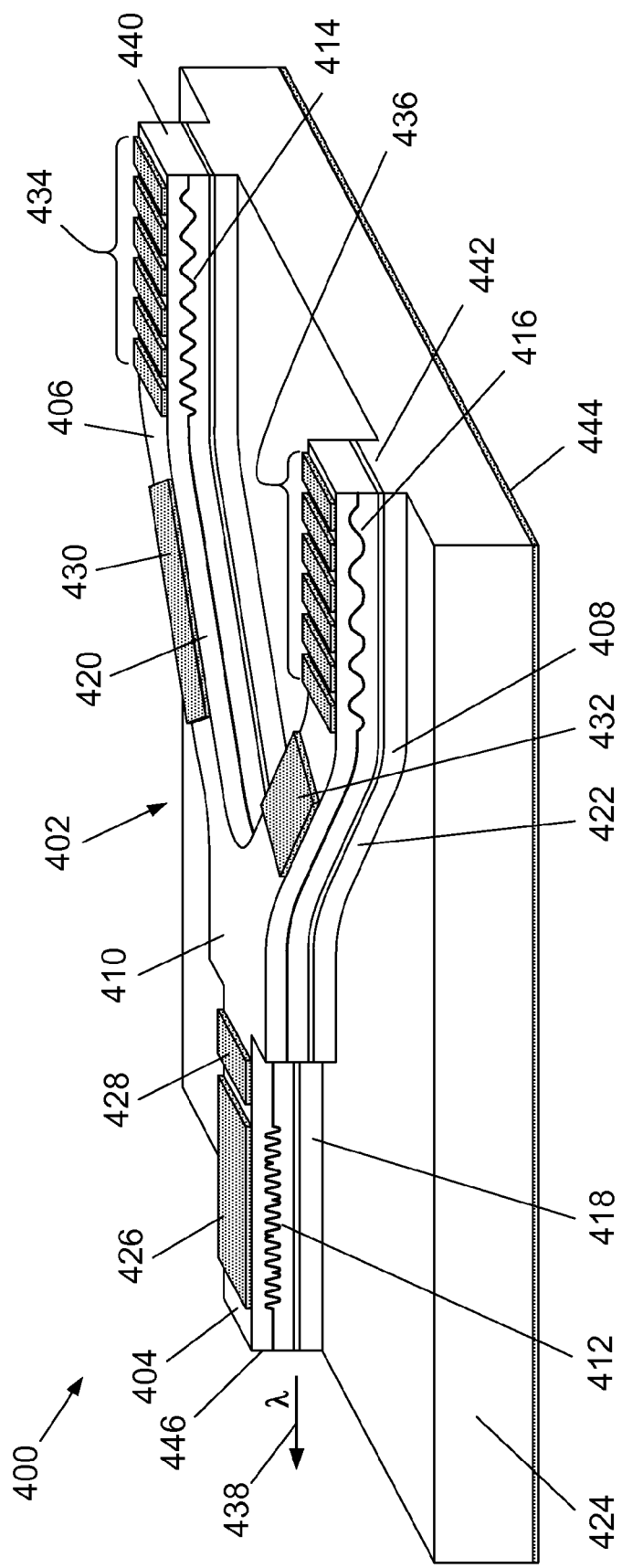
FIG. 4 shows a schematic illustration of a DBR laser with a branched optical waveguide.

FIG. 4 shows schematically a first embodiment of the present invention. A semiconductor laser 400 has a Y-shaped, branched optical waveguide 402. The illustrated optical waveguide is a ridge waveguide, although other designs of waveguide may also be suitable and will be known to those skilled in the art. The optical waveguide 402 comprises a "stem" waveguide section 404, a first "branch" waveguide section 406 and a second "branch" waveguide section 408. The first and second branch waveguide sections 406 and 408 are optically in parallel, and optically coupled to the stem waveguide section 404 by means of a 1×2 optical coupler 410. A stem optical reflector 412 is provided in the stem waveguide section 404, and is tunable. First and second tunable branch optical reflectors 414, 416 are respectively disposed on the first branch and second branch waveguide sections 404, 406 and 408.

The optical reflectors 412, 414, 416 are distributed Bragg reflectors (DBRs), comprising gratings written within the respective waveguide sections 404, 406, 408 by a corrugated surface between two semiconductor layers of different refractive indices. The gratings have been illustrated schematically in FIG. 4 as sinusoidal corrugations, but, due to the typical etching process used to create the corrugated surface, the corrugations typically comprise a predominantly binary pattern.

Figure 5:
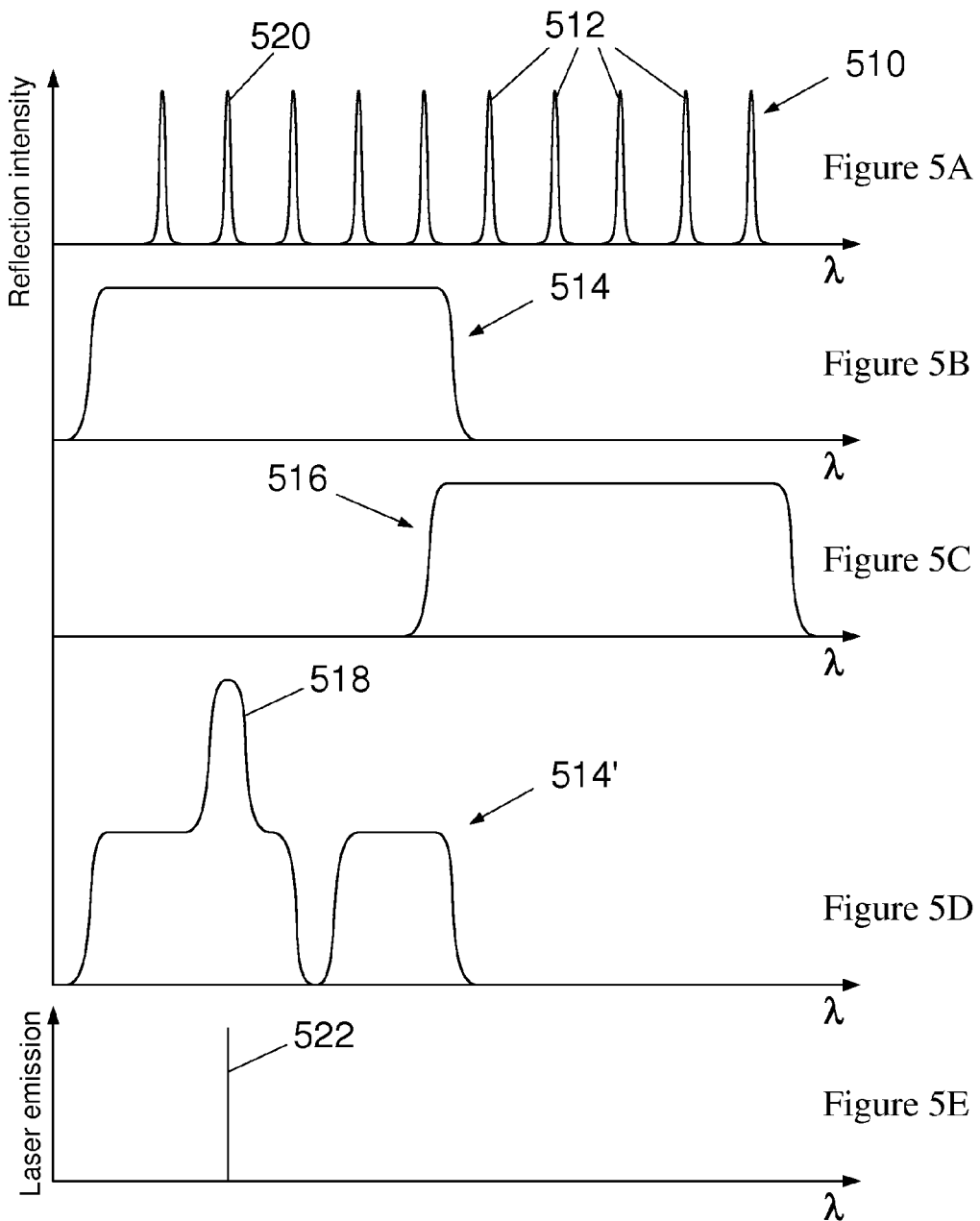
FIGS. 5A-5E schematically show reflection spectra and a laser emission spectrum associated with the DBR laser of FIG. 4.

The stem optical reflector 412 is designed such that it produces a reflection spectrum 510 of peaks 512 that is comb-like with respect to wavelength and which is illustrated schematically in FIG. 5A. Such an optical reflector may be a phase-change DBR, as is disclosed in U.S. Pat. No. 6,345,135. It will be appreciated that other designs of DBR that produce comb-like reflection spectra, such as sampled gratings, may also be used.

The first and second tunable branch optical reflectors 414, 416 produce broad reflection spectra of substantially uniform intensity, the two spectra being substantially spectrally adjacent in wavelength, as is illustrated respectively in FIGS. 5B and 5C.

There may be a small overlap in wavelength of the reflection spectra of the first and second tunable branch optical reflectors 414, 416. The first and second tunable branch optical reflectors 414, 416 may be chirped DBRs, comprising chirped gratings in which the pitch of the grating varies along its length. The reflection spectra 514, 516 of the first and second tunable branch optical reflectors 414, 416 are shown schematically, with a uniform top hat-like profile, without any of the ripples and end peaks that typically occur in an actual laser.

A phase control section 418 is disposed on the stem waveguide section 404 between the stem optical reflector 412 and the optical coupler 410. First and second gain sections 420, 422 are disposed on the first and second branch waveguide sections 406, 408 respectively, between the corresponding tunable branch optical reflectors 414 and 416 and the optical coupler 410. The tunable branch optical reflectors 414, 416 are adapted to reflect within different wavelength ranges, e.g. substantially corresponding with the C-band and L-band respectively.

Advantageously the first and second gain sections 420, 422 comprise semiconductor materials with different light emission properties, such that they emit light with gain spectra centred at different wavelengths, adapted to suit the tuning ranges of the respective first and second tunable branch optical reflectors 414, 416. The gain spectrum of one gain section 420, 422 may be centred in the C-band and the gain spectrum of the other gain section may be centred in the L-band. The different light emission properties of the gain sections 420, 422 may be caused by having different bandgaps in their active layers.

Electrodes are provided on the surface of the optical waveguide to drive the separate sections, typically in cooperation with a back electrode 444, which is provided on the opposite side of the substrate 424 from the ridge of the optical waveguide. The back electrode 444 would typically be electrically grounded. Electrodes 426, 428, 430 and 432 are provided on each of the stem optical reflector 412, phase section 418, and gain sections 420, 422, 424 respectively. A plurality of electrode segments 434 and 436 are provided on the first and second tunable branch optical reflectors 414, 416, such that portions of the reflection spectrum of each DBR may be independently tuned with respect to wavelength.

In operation, a drive current through one of the gain sections 420, 422 produces light emission within the branched optical waveguide 402, and selective tuning of segments of a tunable branch optical reflector 414, 416 produces a reinforced reflective peak 518 (FIG. 5D) at a wavelength that corresponds with a single peak 520 selected from the comb of reflective peaks 512 of the stem optical reflector 412. This produces an optical laser cavity for which the optical gain exceeds the optical loss, and so the laser cavity lases on a laser cavity mode at a wavelength corresponding with the selected single peak 520. The laser emission spectrum 522 is illustrated schematically in FIG. 5E, with the same wavelength scale as FIGS. 5A-5D, producing an optical output 438 through the stem optical reflector 412 and facet 446 of the laser. The operation of a laser, with an unbranched optical waveguide, by a related, digital supermode tuning mechanism is described in more detail in U.S. Pat. No. 7,145,923. In the laser 400 of FIG. 4, the provision of two, tunable branch optical reflectors 414, 416 on optically parallel branch waveguide sections 406, 408 of a branched optical waveguide 402, may enable the tuning range of the laser 400 to be substantially broader than that of an unbranched DBR laser that operates by the same tuning mechanism.

The lasing cavity of the laser 400 may be formed between the stem optical reflector 412 and either of the first and second tunable branch optical reflectors 414, 416. Consequently, it is possible to operate such a DBR laser 400 having a branched optical waveguide 402 with a plurality of differently shaped unbranched lasing cavities, with the shape of each lasing cavity being a function of which of the branch waveguide sections 406, 408 that is used as an end optical reflector of the lasing cavity.

The phase control section 418 and the optical reflectors 412, 414, 416 may be electrically tuned either by the application of a forward bias, producing a current injection induced refractive index change, or by the application of a reverse bias, producing a field induced refractive index change. Bias is applied to sections of the laser 400 by means of respective electrodes 426, 428, 430, 432, 434, 436 disposed on the waveguide and the back electrode 444.

It may also be possible to form a lasing cavity in which segments of the first and second tunable branch optical reflectors 414, 416 are tuned together to form a reinforced reflective peak. Such a mode of operation introduces a further possible shape of lasing cavity within the branched optical waveguide, namely a Y-shaped, branched lasing cavity. To facilitate such operation, it may be advantageous to provide two phase control sections within the laser cavity, with at least one on a branch waveguide section 406, 408, between the optical coupler 410 and the respective tunable branch optical reflector 414, 416.

The DBR laser 400 may be monolithically integrated with other optoelectronic components, such as a semiconductor optical amplifier (SOA), which may be located on the opposite side of the stem optical reflector 412 from the optical coupler 410, and into which the output 438 of the laser is optically coupled. Photo-detectors (e.g. photodiodes) may also be monolithically integrated into the branch waveguide sections 406, 408 on the opposite side of the tunable branch optical reflectors 414, 416 from the optical coupler 410.

It may be advantageous to suppress the reflection of light back into the waveguide sections 404, 406, 408 from the facets 440, 442, 446 of the laser 400, which could otherwise couple into the lasing cavity and adversely affect performance of the laser. Methods of suppressing such reflections will be known to one skilled in the art and include the following. Anti-reflection coatings may be provided on the facets 440, 442, 446. Reflection of light from a facet 440, 442, 446 can be suppressed by the provision of a curve in the waveguide section 404, 406, 408 adjacent to the facet such that the end of the waveguide is non-perpendicular to the facet, being angled such that light passing along the waveguide and reflected from the facet is not coupled back into the waveguide. An optically absorbing element may be provided between each tunable branch optical reflector 414, 416 and facet 440, 442, and may comprise a photodetector. The waveguide ridge may be absent in selected areas such that light passing through a tunable branch optical reflector 414, 416 from within the laser cavity ceases to be guided. Selective areas of waveguides may be made optically absorbent by means of ionic implantation, for example by hydrogen or helium ionic implantation.

Unused segments of the electrodes 434, 436 on the first and second branch waveguide sections 406, 408 that are outside the laser cavity may be reverse biased to provide enhanced optical absorption of stray light within the branched optical waveguide 402 that is emitted from the laser cavity through the first and second tunable branch optical reflectors 414, 416. Similarly a gain section 420, 422 on a branch waveguide section 406, 408 that is not within the laser cavity may also be reverse biased to provide increased optical absorption of stray light within the branched optical waveguide 402.

Figure 6:
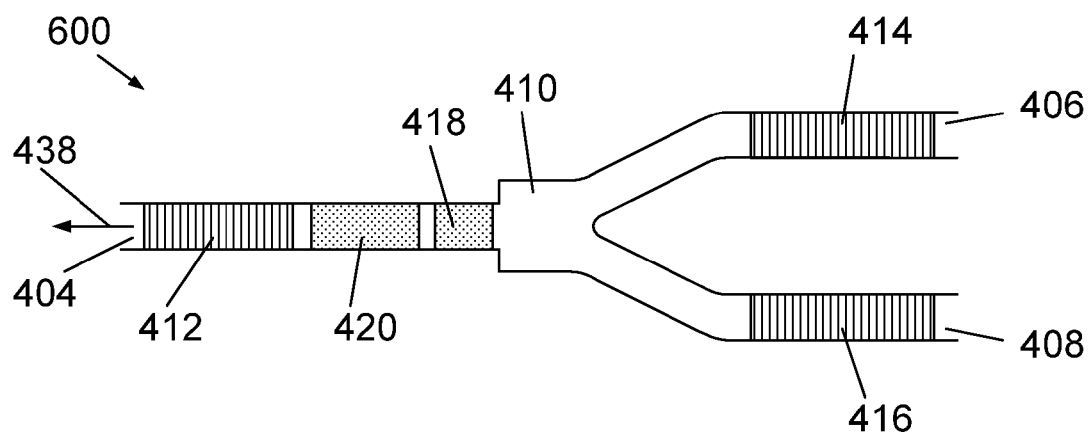
FIG. 6 shows a schematic plan view illustration of a DBR laser according the design of FIG. 4.

FIG. 6 shows a schematic plan view of a further laser 600. The laser 600 is similar to that illustrated in FIG. 4, and like numbers have been used where like components are present. The stem optical reflector 412 and the first and second tunable branch optical reflectors 414, 416 are optically coupled by means of an optical coupler 410. A phase control section 418 and a gain section 420 are provided between the stem optical reflector 412 and the optical coupler 410, and the gain section 620 emits light that is coupled into both of the first and second branch waveguide sections 406, 408. Phase control sections may alternatively be provided on one or each of the branch waveguide sections 406, 408.

Figure 7:
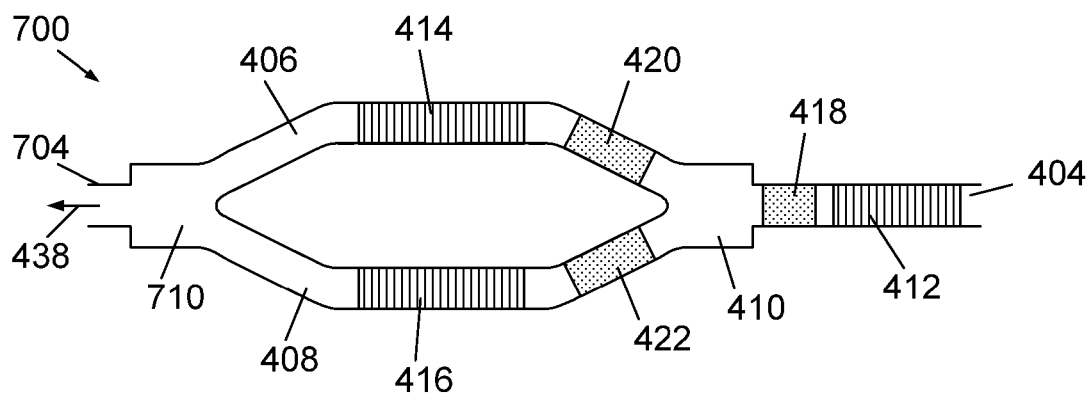
FIG. 7 shows a schematic plan view illustration of an alternative DBR laser with a branched optical waveguide.

FIG. 7 shows a schematic plan view of a laser 700 in which the stem waveguide section 404, stem optical reflector 412 and the phase control section 418 are provided on the opposite side of the optical coupler 410 from the optical output 438 of the laser. Laser emission passes out of the laser cavity through either of the tunable branch optical reflectors 414, 416. The branch waveguide sections 406, 408 are optically coupled together by a further optical coupler 710, and output light 438 is emitted through a common output waveguide section 704.

Different designs of optical coupler are known to one skilled in the art. The optical coupler of the present invention may be chosen from a list comprising at least a Y-branch coupler and a multimode interference coupler (MMI).

Advantageously the optical coupler may have a tunable split ratio. Tunable split ratio MMIs are known (e.g. *InGaAsP/InP Multi-Mode Interference Photonic Switches for Monolithic Photonic Integrated Circuits*, Jpn. J. Appl. Phys. Vol. 38 (1999) pp. 1269-1272), in which control electrodes are located on an MMI's multimode waveguide to correspond with locations within the waveguide at which the light re-images. However, such devices may be susceptible to wavelength dependant transmission performance. A further design of optical coupler with a tunable split ratio comprises a Mach-Zehnder modulator, in which a pair of waveguide sections connect together a pair of optical couplers.

Figure 8:
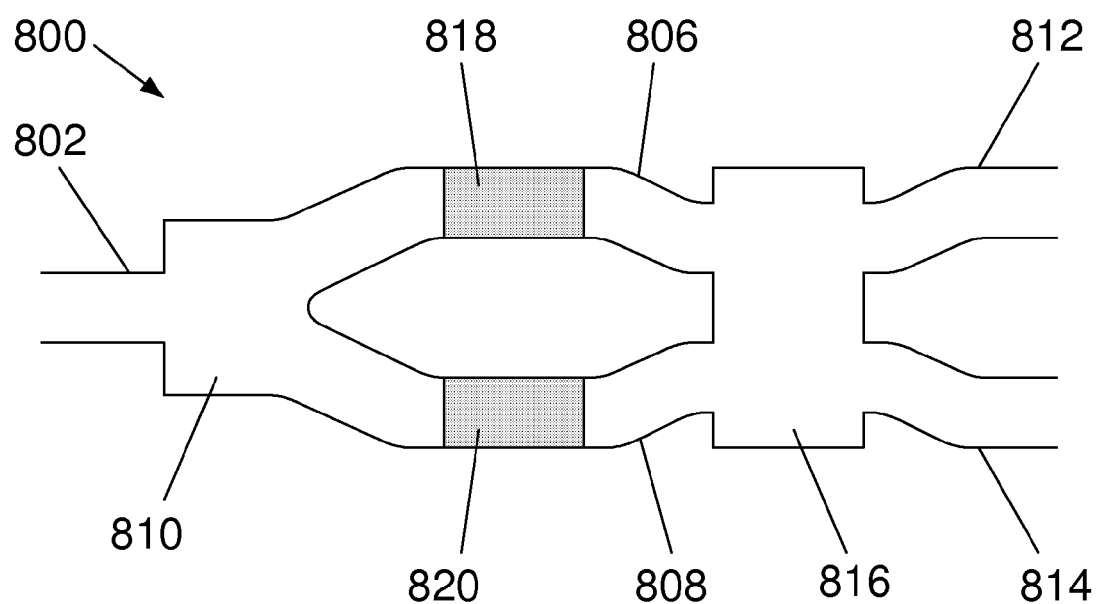
FIG. 8 shows a schematic plan view of a tunable optical splitter.

FIG. 8 illustrates a 1×2 optical coupler 800 with a tunable split ratio. The optical coupler 800 has a common waveguide 802 that is optically coupled to a first pair of waveguides 806, 808 by means of a 1×2 optical coupler 810, and a second pair of waveguides 812, 814 optically coupled to the first pair of waveguides 806, 808 by means of a 2×2 optical coupler 816. Phase modulators 818, 820 and corresponding control electrodes are provided on the first pair of waveguides 806, 808. By control of the phase modulators 818, 820 the direction of transmission of light can be switched from coupling between the common waveguide 802 and one of the second pair of waveguides 812, 814 to coupling between the common waveguide and the other of the second pair of waveguides. Such a 1×2 optical switch 800 may be used in place of an optical coupler 410 to provide improved performance.

The specific embodiments of the present invention that have been discussed above concern a DBR laser tuned by the digital supermode tuning method. However, one skilled in the art will recognise that this invention may be applied to DBR lasers that operate by other tuning methods, including Vernier tuned DBR lasers. In a Vernier tuned DBR laser each branch waveguide section may be forked into two or more sub-branch waveguide sections having tunable DBRs with comb-like reflection spectra of differently spaced reflective peaks that are Vernier tunable.

Figure 9:
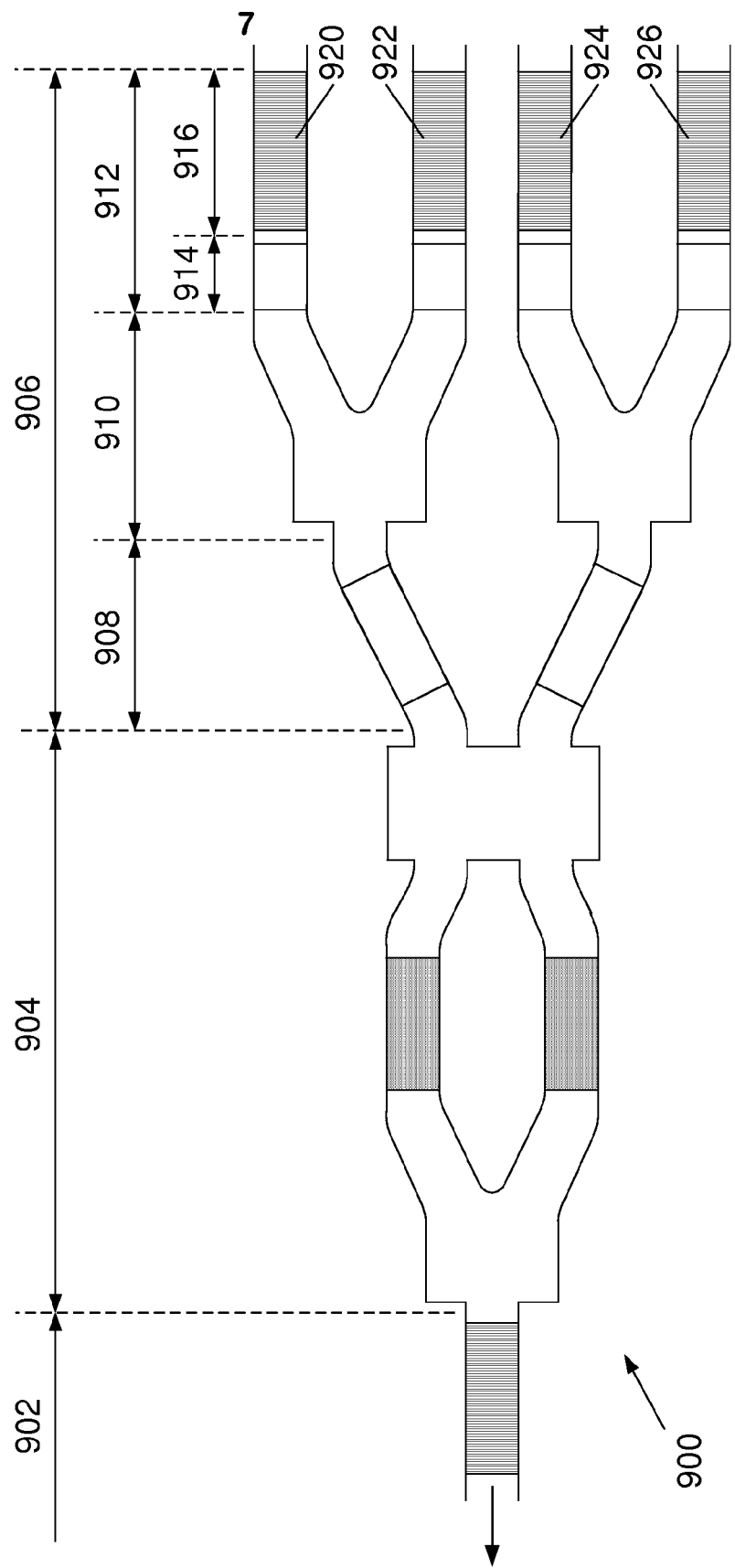
FIG. 9 is a schematic plan view illustration of a further alternative DBR laser with a branched optical waveguide.

FIG. 9 illustrates a Vernier tunable DBR laser 900. The DBR laser 900 comprises a common output waveguide section 902, having a broadband reflector that provides a common end to the different laser cavities that may be operated in the laser waveguide. The broadband reflector may be provided by means such as a DBR, a notched waveguide or a facet. The common output waveguide section 902 is optically coupled to branch waveguide sections 906 by a tunable optical coupler 904. Each branch waveguide section comprises a gain section 908 optically coupled to two sub-branch waveguide sections 912 by optical couplers 910. The sub-branch waveguide sections 912 each comprise a phase control section 914 and a tunable sub-branch optical reflector 916, which may be provided by a DBR.

The tunable optical reflector of each branch waveguide section 906 is composite, being provided by a pair of tunable sub-branch optical reflectors 916 with differently spaced, comb-like reflection spectra that can be Vernier tuned. Each composite tunable optical reflector provides tuning of the DBR laser 900 within a corresponding frequency band. For example, the composite tunable optical reflectors may be provided by Vernier tunable pairs of DBRs, with a first pair of DBRs 920 and 922 tunable within the C-band, and a second pair of DBRs 924 and 926 tunable within the L-band.

Advantageously a DBR laser according to one of the preferred embodiments described above may comprise a smaller number of individual components than a passively integrated DBR laser array according to the design of FIG. 1 that has the same tuning range. The reduction in the number of components in the device may enable improved manufacturability and correspondingly increased manufacturing yield.

It will be understood that many variations may be made to the above described embodiments without departing from the scope of the present invention.

The invention claimed is:

1. A tunable semiconductor laser, comprising:
    a branched optical waveguide comprising a stem waveguide section with a stem optical reflector therein and optically coupled to at least two branch waveguide sections having tunable branch optical reflectors therein; and
    a gain section bounded by the stem optical reflector and at least one of the tunable branch optical reflectors;
    wherein the stem optical reflector is a distributed Bragg reflector (DBR),
    wherein one of the tunable branch optical reflectors has a reflection spectrum tunable within a first wavelength range, and another of the tunable branch optical reflectors has a reflection spectrum tunable within a second wavelength range, different to the first wavelength range, the first and second wavelength ranges overlapping by less than 25% of the width of one of the wavelength ranges, and
    wherein, during operation a lasing cavity is formed between the stem optical reflector and at least one of the tunable branch optical reflector.

2. The tunable semiconductor laser according to claim 1, wherein the lasing cavity is formed between the stem optical reflector and a selected combination of tunable branch optical reflectors.

3. The tunable semiconductor laser according to claim 1, wherein a tunable branch optical reflector is provided within each branch waveguide section.

4. The tunable semiconductor laser according to claim 1, wherein each tunable branch optical reflector is a DBR.

5. The tunable semiconductor laser according to claim 1, wherein the stem optical reflector is a broadband reflector.

6. The tunable semiconductor laser according to claim 1, wherein the stem optical reflector is tunable and comprises a stem tunable DBR having a comb-like reflection spectrum of reflective peaks.

7. The tunable semiconductor laser according to claim 6, wherein the stem optical reflector is a phase change DBR.

8. The tunable semiconductor laser according to claim 6, wherein the stem optical reflector is a sampled grating.

9. The tunable semiconductor laser according to claim 6, wherein;
    the tunable branch optical reflectors comprise tunable branch DBRs adapted to reflect at a plurality of wavelengths;
    one or more portions of the reflection spectra of the tunable branch DBRs are capable of being selectively tuned to a lower wavelength corresponding with the wavelength of reflection of another portion, thereby enhancing the reflectivity at that lower wavelength,
    the lower wavelength substantially coinciding with a peak of the reflection spectrum of the stem tunable DBR, thereby enabling the laser to lase at that lower wavelength.

10. The tunable semiconductor laser according to claim 1, wherein the optical coupling is provided by an optical coupler with a substantially fixed split ratio.

11. The tunable semiconductor laser according to claim 1, wherein the optical coupling is provided by an optical coupler with a tunable split ratio.

12. The tunable semiconductor laser according to claim 1, wherein the gain section is provided within the stem waveguide section.

13. The tunable semiconductor laser according to claim 1, wherein the gain section is provided within one or more branch waveguide sections.

14. The tunable semiconductor laser according to claim 1, wherein a plurality of gain sections are provided, which have gain spectra centered at different wavelengths.

15. The tunable semiconductor laser according to claim 1, wherein one or more phase control sections are provided, each phase control section being provided on the stem waveguide section and/or a branch waveguide section, such that it is bounded by the stem optical reflector and a tunable branch optical reflector.

16. The tunable semiconductor laser according to claim 1, wherein, in operation, the tunable branch optical reflector is reflective and the stem optical reflector is partially transmissive at the lasing wavelength, such that light is emitted from the lasing cavity through the stem optical reflector.

17. The tunable semiconductor laser according to claim 1, wherein, in operation, the stem optical reflector is reflective and a tunable branch optical reflector is partially transmissive at the lasing wavelength, such that light is emitted from the lasing cavity through the tunable branch optical reflector.

18. The tunable semiconductor laser according to claim 17, wherein the branch waveguide sections are optically coupled to a common output waveguide section, such that light emission transmitted through each tunable branch optical reflector is coupled to the common output waveguide section.

19. The tunable semiconductor laser according to claim 1, wherein at least one of the branch waveguide sections is coupled to a plurality of sub-branch waveguide sections, each having a tunable sub-branch optical reflector therein, such that each tunable branch optical reflector comprises a plurality of tunable sub-branch optical reflectors.

20. The tunable semiconductor laser according to claim 19, wherein the tunable sub-branch optical reflectors have comb-like reflection spectra of reflective peaks, and the reflective peaks of the tunable sub-branch optical reflectors of each branch waveguide section have differently spaced reflective peaks.

21. The tunable semiconductor laser according to claim 1, wherein light emitted from the tunable semiconductor laser is coupled to a semiconductor optical amplifier.

22. A method of operating a tunable semiconductor laser according to claim 1, comprising tuning one or more of the stem optical reflector, the tunable branch optical reflectors, and a phase section, such that a lasing cavity is formed between the stem optical reflector and at least one selected tunable branch optical reflector.

23. The method according to claim 22, wherein one of the tunable branch reflectors is tuned to tune the operating wavelength of the laser.

24. The method according to claim 22, wherein the stem optical reflector is tuned to tune the operating wavelength of the laser.

25. The method according to claim 22, wherein the phase section is tuned to tune the operating wavelength of the laser.

26. The method according to claim 22, wherein the lasing cavity is formed between the stem optical reflector and one tunable branch optical reflector.

27. The method according to claim 22, wherein the laser is formed between the stem optical reflector and a selected combination of tunable branch optical reflectors.

28. The method according to claim 22, wherein the laser is tuned by the method of digital supermode tuning.

29. The method according to claim 22, wherein the laser is tuned by the method of Vernier tuning.

30. The tunable semiconductor laser according to claim 1, wherein the first and second wavelength ranges overlap by less than 15% of the width of one of the wavelength ranges.

31. The tunable semiconductor laser according to claim 1, wherein the lasing cavity is formed between the stem optical reflector and one of the tunable branch optical reflectors.

* * * * *